(12) United States Patent
Ma

(10) Patent No.: US 7,649,747 B2
(45) Date of Patent: Jan. 19, 2010

(54) IC DEVICE HAVING COMPACT DESIGN

(75) Inventor: Sung Chuan Ma, Taoyuan County (TW)

(73) Assignee: AFlash Technology Co., Ltd, Taoyuan County (TW)

( * ) Notice: Subject to any disclaimer, the term of this patent is extended or adjusted under 35 U.S.C. 154(b) by 82 days.

(21) Appl. No.: 12/135,790

(22) Filed: Jun. 9, 2008

(65) Prior Publication Data
US 2009/0045520 A1 Feb. 19, 2009

(51) Int. Cl.
*H05K 1/18* (2006.01)
(52) U.S. Cl. .................. 361/761; 361/763; 361/766; 361/760; 361/782
(58) Field of Classification Search ......... 174/260–266, 174/250, 255, 257; 361/748, 751, 760, 761, 361/762, 763, 766, 782; 257/773, E23.169
See application file for complete search history.

(56) References Cited

U.S. PATENT DOCUMENTS

| | | | | |
|---|---|---|---|---|
| 6,757,178 B2* | 6/2004 | Okabe et al. | ............... | 361/793 |
| 7,227,240 B2* | 6/2007 | Knapp et al. | ............... | 257/531 |
| 7,248,138 B2* | 7/2007 | Chiang et al. | ............... | 336/200 |
| 7,488,897 B2* | 2/2009 | Ogawa et al. | ............... | 174/260 |
| 2006/0007662 A1* | 1/2006 | Vasudivan et al. | ........... | 361/763 |
| 2006/0059682 A1* | 3/2006 | Horng et al. | .................. | 29/832 |
| 2006/0133057 A1* | 6/2006 | McGregor et al. | .......... | 361/763 |
| 2006/0191711 A1* | 8/2006 | Cho et al. | .................... | 174/260 |
| 2007/0030659 A1* | 2/2007 | Suzuki et al. | ............... | 361/793 |
| 2007/0147014 A1* | 6/2007 | Chang et al. | ................ | 361/760 |

\* cited by examiner

*Primary Examiner*—Jinhee J Lee
*Assistant Examiner*—Hoa C Nguyen
(74) *Attorney, Agent, or Firm*—Jackson IPG PLLC

(57) ABSTRACT

An IC device has a compact design. Capacitors, resistances and inductances are directly integrated in the IC device without packaging in advance. Thus, the IC device obtained has a slim size and an electric apparatus using the IC device has a big space for use.

6 Claims, 6 Drawing Sheets

IC DEVICE HAVING COMPACT DESIGN

FIELD OF THE INVENTION

The present invention relates to an integrated circuit (IC) device; relates to an IC device with a compact and slim size for obtaining an electric apparatus having a big space for use.

DESCRIPTION OF THE RELATED ART

A general IC device has an IC board, where the IC board has packaged resistances, packaged capacitors and/or packaged inductances on a circuit layout area.

Although the above IC device is used in an electric apparatus, the resistances, the capacitors and/or the inductances are separately packaged to be set on the IC board so that the IC device obtained occupies a big space and a space for use in the electric apparatus is reduced. In addition, the IC device obtained is used individually and the IC devices can not be piled up for use altogether. Hence, the prior art does not fulfill all users' requests on actual use.

SUMMARY OF THE INVENTION

The ma in purpose of the present invention is to obtain an IC device with a compact and slim size, where an electric apparatus using the IC device thus has a big space for use.

To achieve the above purpose, the present invention is an IC device having a compact design, comprising an IC board; a first metal layer on the IC board; an insulated layer on the first metal layer; and a second metal layer on the insulated layer, where the IC board has a circuit layout area on a surface and has a conductive medium area at a side connecting to the circuit layout area; the first metal layer has a first concave area on a surface and the first concave area has a first conductive plate with an end connecting to the conductive medium area; the insulated layer has a second concave area on a surface and the second concave are a has an impedance element with two ends connecting to the conductive medium area for forming a resistance; the second metal layer has a third concave area and a fourth concave area on a surface; the third concave area has a second conductive plate with an end connecting to the conductive medium area for obtaining a capacitor coordinated with the first conductive plate of the first concave area; and the fourth concave area has a conductive coil with an end connecting to the conductive medium area for obtaining an inductance. Accordingly, a novel IC device having a compact design is obtained.

BRIEF DESCRIPTION OF THE DRAWINGS

The present invention will be better understood from the following detailed description of the preferred embodiment according to the present invention, taken in conjunction with the accompanying drawings in which.

DESCRIPTION OF THE PREFERRED EMBODIMENT

The following description of the preferred embodiment is provided to understand the features and the structures of the present invention.

Figure 1:
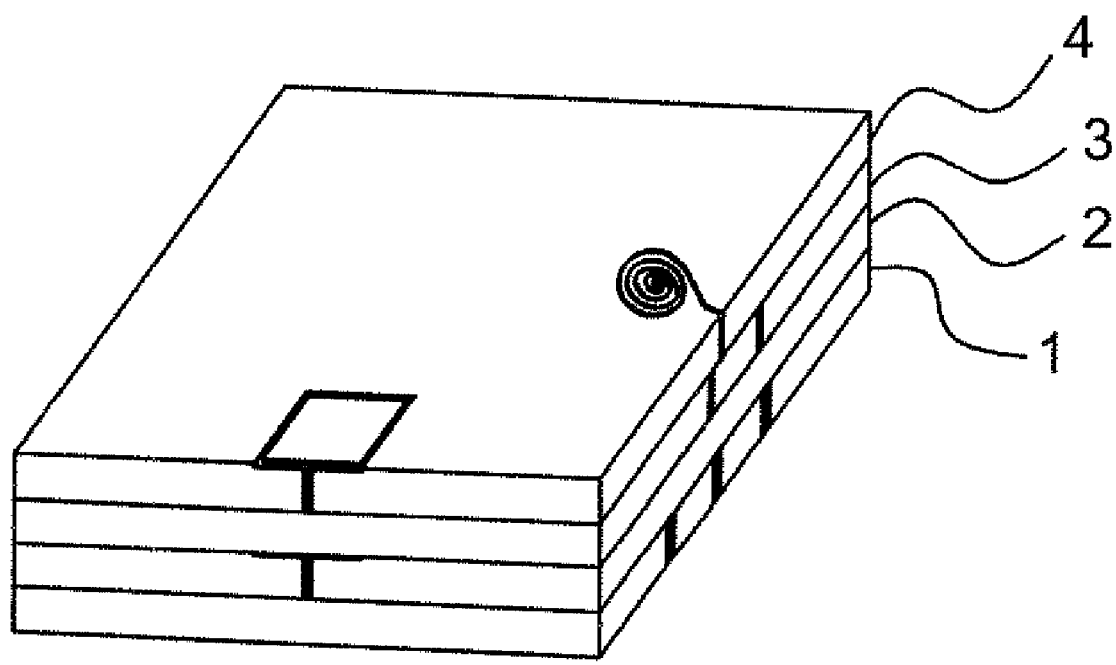
FIG. 1 is the perspective view showing the preferred embodiment according to the present invention.
Figure 2:
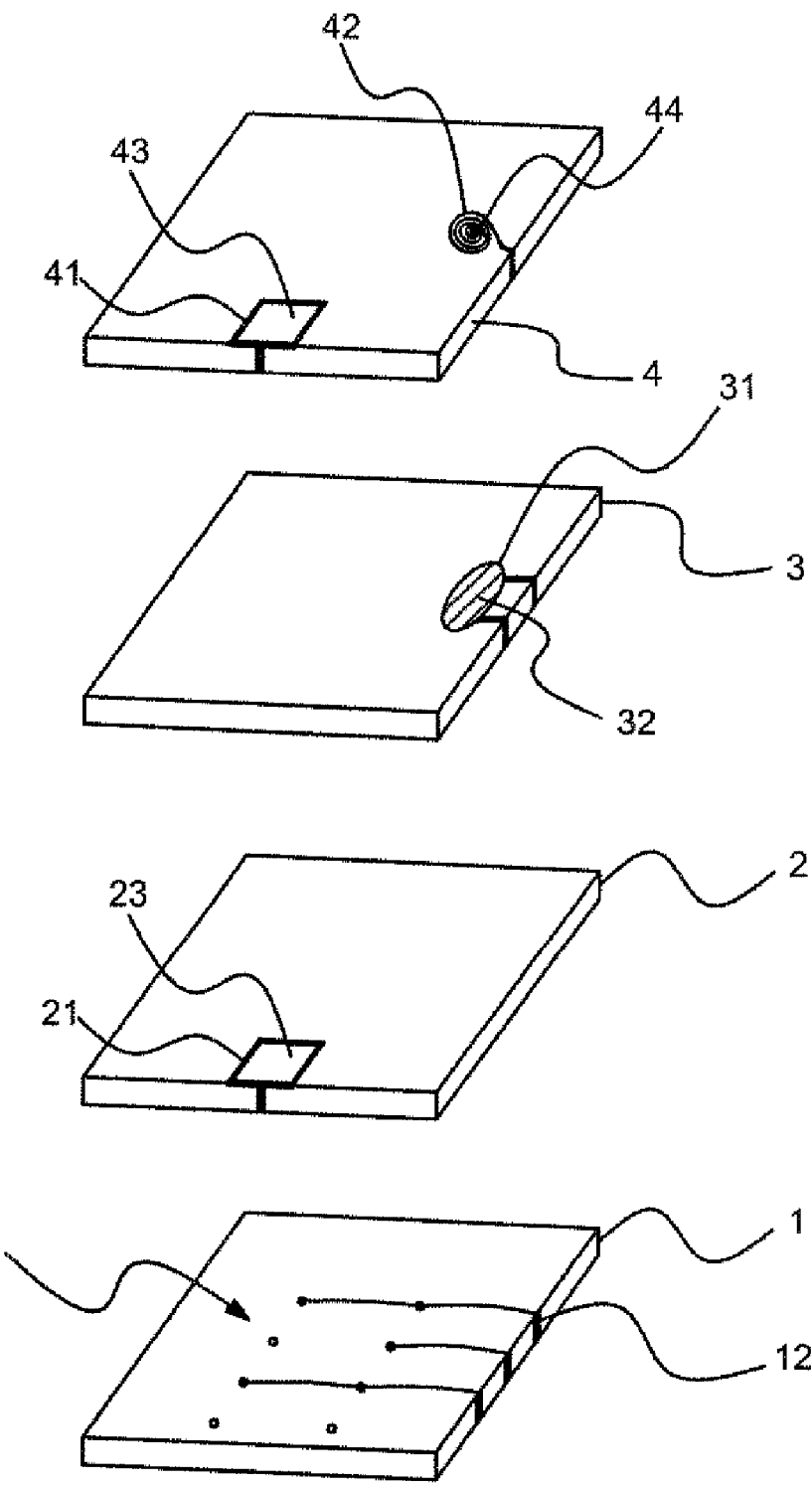
FIG. 2 is the structural view showing the preferred embodiment.

Please refer to FIG. 1 and FIG. 2 which are a perspective view and a structural view showing a preferred embodiment according to the present invention. As shown in the figures, the present invention is an integrated circuit (IC) device having a compact design, comprising an IC board 1, a first metal layer 2, an insulated layer 3 and a second metal layer 4, w here an IC device with a compact and slim size is obtained and an electric apparatus using the IC device thus has a big space for use.

The IC board 1 has a circuit layout area 11 on a surface; and has a conductive medium are a 12 at a side to connect to the circuit layout area 11.

The first metal layer 2 is deposed on a surface of the IC board 1; the first metal layer 2 has a first concave area 21 on a surface; and, the first concave area 21 has a first conductive plate 22, where the first conductive plate 22 is connected with the conductive medium area 12 at an end and the first conductive plate 22 is made of a metal oxide or a silver colloid.

The insulated layer 3 is deposed on a surface of the first metal layer 2; and the insulated layer 3 has a second concave area 31 on a surface, where the second concave area 31 has an impedance element 32 with two ends connecting to the conductive medium area 12 and the impedance element 32 is made of carbon.

The second metal layer 4 is deposed on a surface of the insulated layer 3; and, the second metal layer 4 has a third concave area 41 and a fourth concave area 42 on a surface of the second metal layer 4, where the third concave area 41 has a second conductive plate 43 with an end connecting to the conductive medium area 12; and the fourth concave area 42 has a conductive coil 44 with an end connecting to the conductive medium area 12.

Thus a novel IC device having a compact design is obtained with the above structure.

Figure 3:
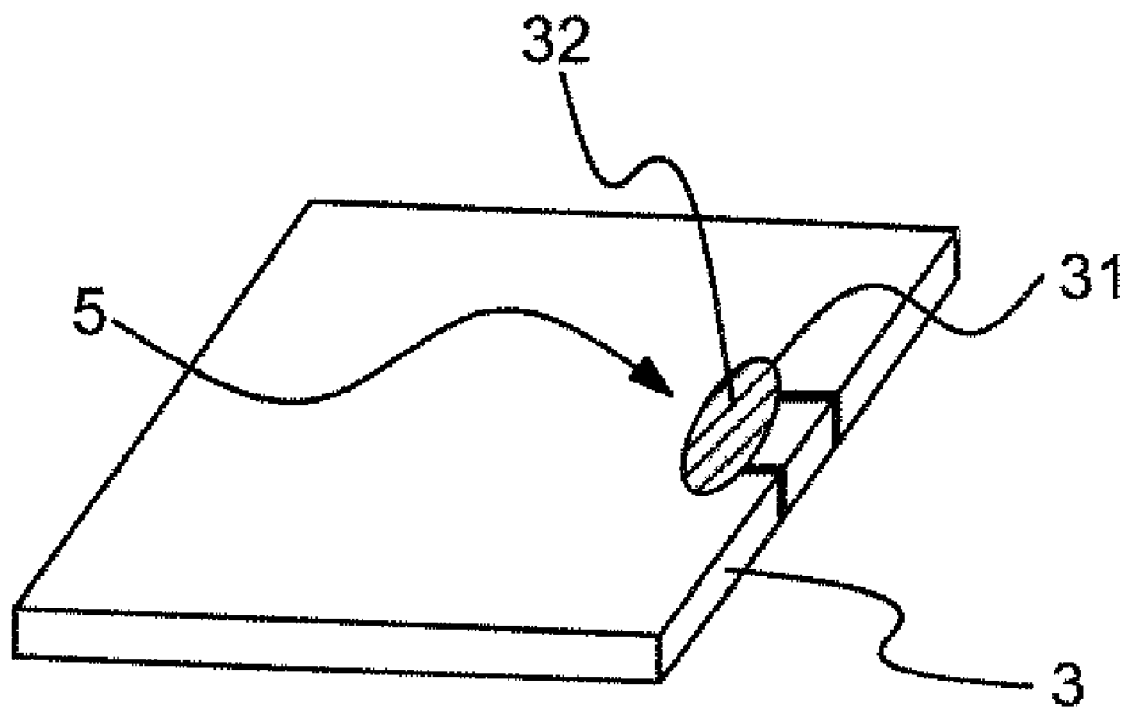
FIG. 3 is the view showing the resistance.
Figure 4:
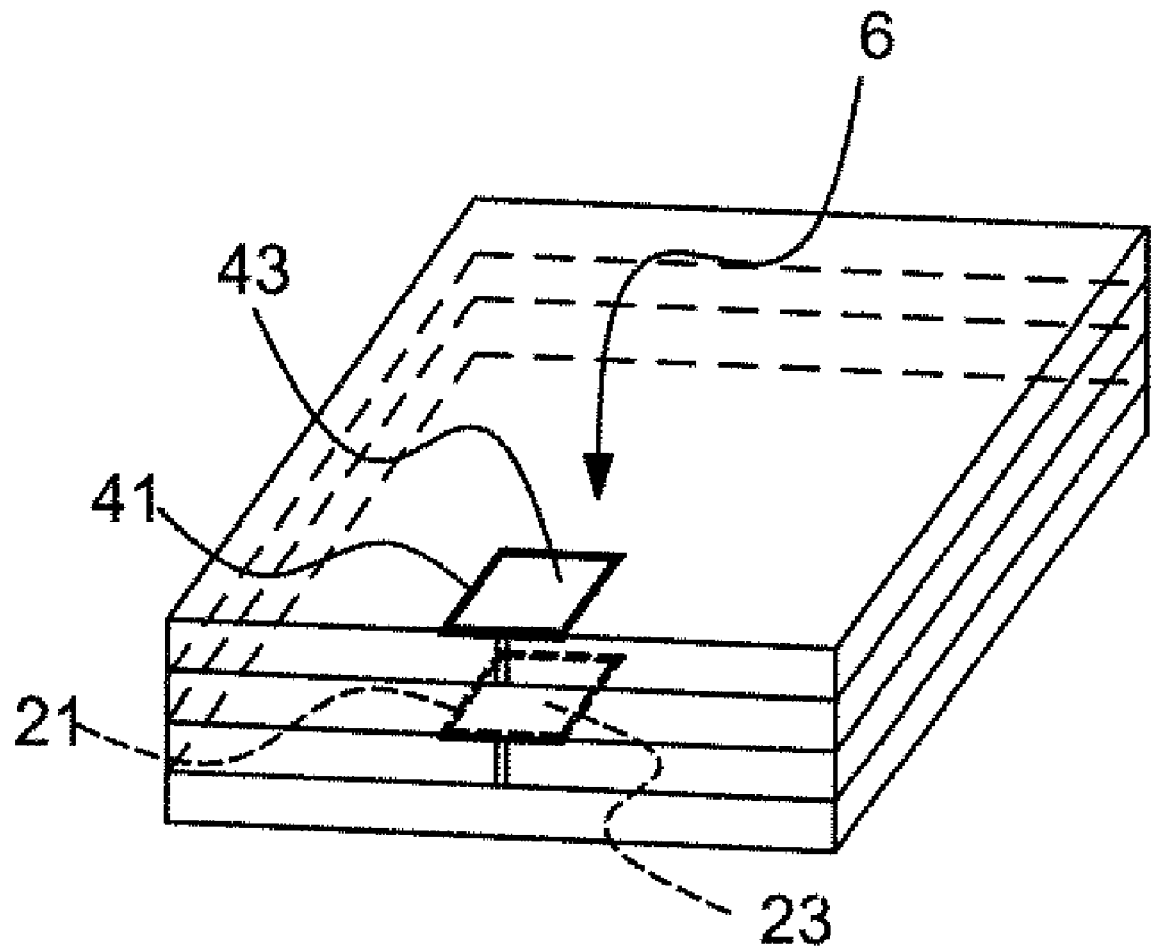
FIG. 4 is the view showing the capacitor.
Figure 5:
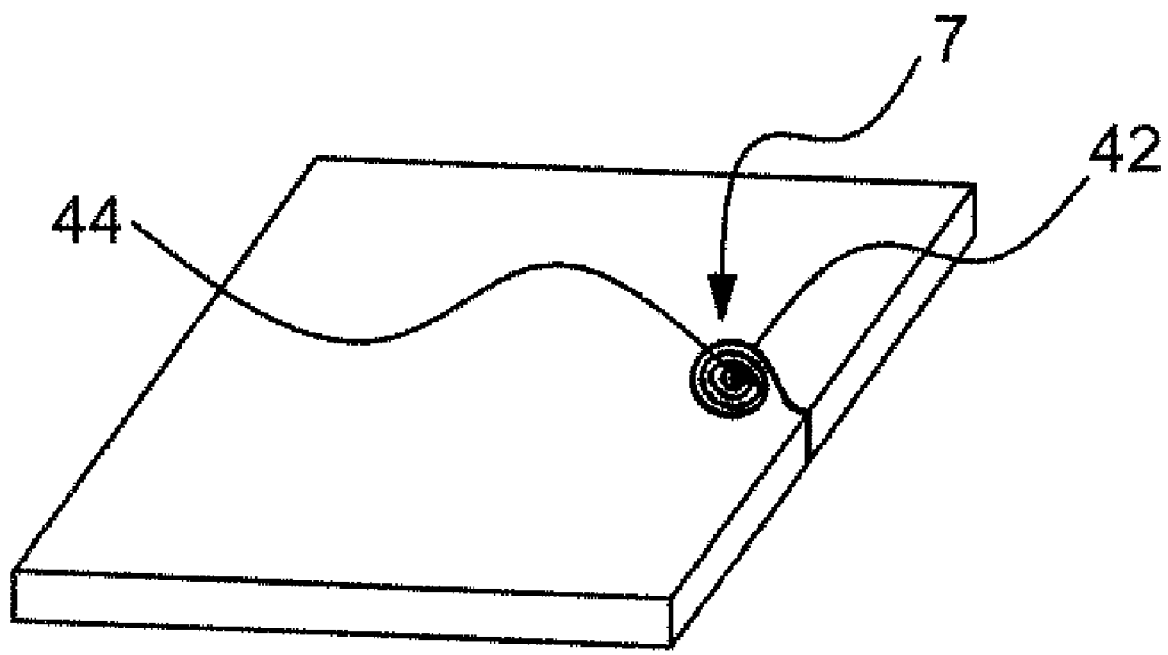
FIG. 5 is the view showing the inductance.

Please refer to FIG. 3 to FIG. 5, which are views showing a resistance a capacitor and an inductance. As shown in the figures, an insulated layer 3 is obtained according to an actual requirement, where an impedance element 32 is set in a second concave are a 31 on a surface of the insulated layer 3 to form a resistance 5 (shown in FIG. 3). A first metal layer 2 and a second metal layer 4 are stacked up on an IC board 1, where a first conductive plate 22 and a second conductive plate 43 are respectively set in a first concave area 21 of the first metal layer 2 and a third concave area 41 of the second metal layer 4 to form a capacitor 6 (shown in FIG. 4). And a conductive coil 44 is set in a fourth concave area 42 to form an inductance 7 (shown in FIG. 5).

Figure 6:
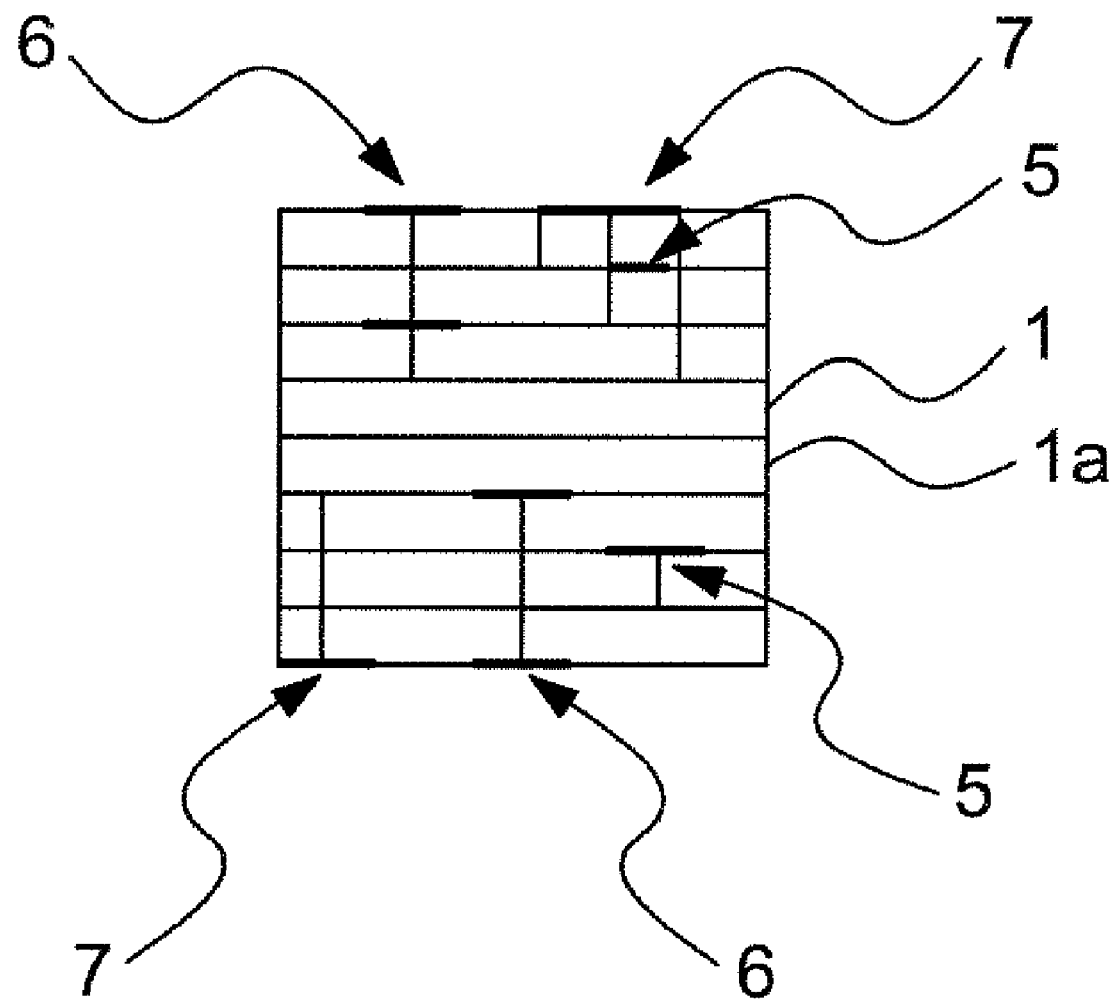
FIG. 6 is the view showing the state of use.

Please refer to FIG. 6, which is a view showing a state of use. As shown in the figure, a plurality of IC devices is piled up, where IC boards 1,1a are stacked up to share and/or connect resistances 5, capacitors 6 and inductances 7 according to actual requirements.

To sum up, the present invention is an IC device having a compact design, where an IC device with a compact and slim size is obtained and an electric apparatus using the IC device thus has a big space for use.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. An integrated circuit (IC) device having a compact design, comprising
    an IC board, said IC board having a circuit layout area on a surface of said IC board, said IC board having a conductive medium area at a side of said IC board, said IC board connecting to said circuit layout area through said conductive medium;
    a first metal layer, said first metal layer being deposed on a surface of said IC board, said first metal layer having a first concave area on a surface of said first metal layer, said first concave area having a first conductive plate, said first conductive plate connecting to said conductive medium area at an end of said first conductive plate;
    an insulated layer, said insulated layer being deposed on a surface of said first metal layer, said insulated layer having a second concave area on a surface of said insulated layer,
        wherein said second concave area has an impedance element connecting to said conductive medium area at two ends of said impedance element and a resistance is obtained with said impedance element; and
    a second metal layer, said second metal layer being deposed on a surface of said insulated layer, said second metal layer having a third concave area and a fourth concave are a on a surface of said second metal layer,
        wherein said third concave area has a second conductive plate connecting to said conductive medium area at an end of said second conductive plate and a capacitor is obtained with said third concave area and said first conductive plate; and
        wherein said fourth concave are a has a conductive coil connecting to said conductive medium area at an end of said conductive coil and an inductance is obtained with said conductive coil.

2. The IC device according to claim 1,
wherein said first conductive plate is made of a metal oxide.

3. The IC device according to claim 1,
wherein said first conductive plate is made of a silver colloid.

4. The IC device according to claim 1,
wherein said second conductive plate is made of a metal oxide.

5. The IC device according to claim 1,
wherein said second conductive plate is made of a silver colloid.

6. The IC device according to claim 1,
wherein said impedance element is made of carbon.

\* \* \* \* \*